US006613633B2

United States Patent
Oh

(10) Patent No.: US 6,613,633 B2
(45) Date of Patent: Sep. 2, 2003

(54) METHOD FOR MANUFACTURING A HIGH POWER SEMICONDUCTOR DEVICE HAVING A FIELD PLATE EXTENDEDLY DISPOSED ON A GATE

(75) Inventor: Han-Su Oh, Cheongju (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 10/207,996

(22) Filed: Jul. 31, 2002

(65) Prior Publication Data

US 2002/0182810 A1 Dec. 5, 2002

Related U.S. Application Data

(62) Division of application No. 09/588,546, filed on Jun. 6, 2000, now Pat. No. 6,448,611.

(30) Foreign Application Priority Data

Jun. 7, 1999 (KR) .......................................... 99/20955

(51) Int. Cl.[7] .............................................. H01L 21/336
(52) U.S. Cl. ..................................... 438/268; 438/286
(58) Field of Search ................................. 438/268, 286; 257/335–346

(56) References Cited

U.S. PATENT DOCUMENTS

| 4,399,449 A | | 8/1983 | Herman et al. |
| 5,055,896 A | | 10/1991 | Williams et al. |
| 5,510,275 A | * | 4/1996 | Malhi .......................... 438/285 |
| 5,514,608 A | | 5/1996 | Williams et al. |
| 5,585,294 A | * | 12/1996 | Smayling et al. ........... 438/307 |
| 5,585,660 A | | 12/1996 | Mei |
| 5,728,607 A | * | 3/1998 | Shibib ......................... 438/135 |
| 5,912,490 A | * | 6/1999 | Hebert et al. ................ 257/340 |
| 5,918,137 A | * | 6/1999 | Ng et al. ..................... 438/454 |
| 6,071,768 A | * | 6/2000 | Duvvury et al. ............. 438/234 |
| 6,087,232 A | * | 7/2000 | Kim et al. ................... 438/289 |
| 6,207,994 B1 | | 3/2001 | Rumennik et al. |
| 2002/0072159 A1 | * | 6/2002 | Nishibe et al. ............. 438/179 |

FOREIGN PATENT DOCUMENTS

JP 58-17676 1/1983

* cited by examiner

*Primary Examiner*—John F. Niebling
*Assistant Examiner*—Angel Roman
(74) *Attorney, Agent, or Firm*—Birch, Stewart, Kolasch & Birch, LLP

(57) ABSTRACT

A method to fabricate a high voltage transistor of a smart power device is discussed. The method includes forming a well of first conductivity in a substrate of second conductivity; forming a drift layer of the second conductivity in the well; forming a source region of the second conductivity in the well between a substrate/well junction and a well/drift layer junction; forming a drain region of the second conductivity in the drift layer, the drain region having relatively higher concentration of dopants relative to the drift layer; and forming a first field oxide layer on the drift layer such that the first field oxide layer is spaced apart from the drain region.

10 Claims, 6 Drawing Sheets

METHOD FOR MANUFACTURING A HIGH POWER SEMICONDUCTOR DEVICE HAVING A FIELD PLATE EXTENDEDLY DISPOSED ON A GATE

This application is a divisional of co-pending application Ser. No. 09/588,546, filed on Jun. 6, 2000 now U.S. Pat. No. 6,448,611 the entire contents of which are hereby incorporated by reference and for which priority is claimed under 35 U.S.C. §120; and this application claims priority of application Ser. No. 20955/1999 filed in KOREA on Jun. 7, 1999 under 35 U.S.C. §119.

BACKGROUND OF THE INVENTION

1. Field of the Invention

The present invention relates to a semiconductor device, and more particularly to a high power semiconductor device and a fabrication method thereof in which a junction breakdown voltage is increased and a snap-back characteristic is improved.

2. Description of the Conventional Art

An integrated circuit combining a control function and a driving function into one chip is called a smart power device. An output terminal of the smart power device is formed with a high power transistor that is operated at high voltages, such as between 15–80V. The logic operations are performed through normal transistors operating at a low voltage such as 5V. The smart power devices are mainly used to drive a display unit such as an LCD (liquid crystal display) or a HDTV (high definition TV).

The high voltage transistor of the smart power device is fabricated by employing a technique where a relatively lightly doped drift region is formed and a heavily doped drain region of the transistor is formed in the drift region. Also field oxide layers are formed above the device's substrate, including above the drift region, to define active regions.

In this technique, it is desirable that the field oxide layer formed above the drift region be spaced apart from an interface between the drift and drain regions, i.e. apart from a drain/drift junction, to increase the breakdown voltage of the device. It is also desirable to increase the snap-back voltage at the junction of the field oxide layer and at an edge of a gate electrode.

A high voltage transistor of a conventional smart power device will be described with references to FIGS. 1 and 2. Same reference numerals denote same elements in these figures. FIG. 1 is a plan view of the high voltage transistor, and FIG. 2 is a longitudinal-sectional view of the transistor taken along line of II—II of FIG. 1.

As shown in FIGS. 1 and 2, an n-type well 110 is formed in a p-type semiconductor substrate 100, and p⁻-type drift region 104 is formed in the n-type well 110. The drift region 104 has a lower concentration of impurities than source/drain regions of the high voltage transistor (described below). The drift region 104 serves as a buffer layer, when a high electric field is applied to the drain region, to prevent junction breakdown and hot carriers from occurring.

A plurality of field oxide layers 101 are formed on the p-type semiconductor substrate 100, the n-type well 110, and the p-type drift region 104.

Gate electrodes 102 are formed covering a predetermined portion of the n-type well 110 and the field oxide layers 101. Note that an end portion of the gate electrode 102 toward a center of the drift region 104 is placed on an upper surface of the field oxide layer 101. This prevents the field oxide layer from being destroyed due to a strong electric field formed at the end portion of the gate electrode 102. The structure also increases the junction breakdown voltage as well.

Heavily doped p⁺-type source and drain regions 103a and 103b are formed inside the n-type well 110 and the drift region 104, respectively. The source region 103a is formed adjacent to an end portion of the gate electrode 102 away from the center of the drift region 104. The drain region 103b is formed adjacent to an edge of the field oxide layer 101 near the center of the drift region 104. As noted above, the impurity concentration is much higher for the source and drain regions relative to the drift region 104.

An insulation layer 106, excluding the contact regions over the source and drain regions 103a and 103b, covers the entire structure including the field oxide layers 101. The insulation layer 106 covers a portion of the drain region 103b to disperse the high electric field formed when voltage is applied to the drain region.

A source electrode 105a and a drain electrode 105b are formed and connected to the source and drain regions 103a and 103b, respectively, as shown.

However, the conventional smart power device described above has at least the following disadvantages. First, a high electric field is formed at the junction where the drift region and the n-well region meet (A in FIG. 1). High electric field is also formed where at the interface where the field oxide layer 101 and the gate electrode 102 meet (B in FIG. 2). These electric fields are not sufficiently dispersed in this construction. Second, the field oxide layer 101 is directly adjacent to the drain region 103b (C in FIG. 2). In this instance, a junction profile is very steep resulting in a low breakdown voltage.

SUMMARY OF THE INVENTION

Therefore, an object of the present invention is to provide a high voltage transistor for a smart power device having a high breakdown voltage in which heavily doped source and drain regions do not directly contact an edge of a field oxide layer, and a fabricating method thereof.

Another object of the present invention is to provide a high voltage transistor for a smart power device having a high breakdown voltage in which a field plate is formed to disperse high electric field, generated when voltage is applied to source and drain regions of the device, to further increase breakdown voltage and improve reliability, and a fabrication method thereof.

To achieve these and other advantages and in accordance with the purpose of the present invention, as embodied and broadly described herein, a high voltage transistor for a smart power device includes: a well of first conductivity formed in a substrate of second conductivity; a drift region of the second conductivity formed in the well; a source region of the second conductivity formed in the well between a substrate/well junction and a well/drift region junction, the source region having relatively higher concentration of dopants relative to the drift region; a drain region of the second conductivity formed in the drift region, the drain region having relatively higher concentration of dopants relative to the drift region; and a field oxide layer formed on the drift region such that an edge of the field oxide layer is spaced apart from the drain region by a predetermined distance. The high voltage transistor further includes a conductive field plate formed above the field oxide layer such that a portion of the field plate extends beyond the field oxide layer towards the drain region.

To achieve these and other advantages and in accordance with the purpose of the present invention, as embodied and broadly described herein, a method to fabricate a high voltage transistor of a smart power device includes: forming a well of first conductivity in a substrate of second conductivity; forming a drift region of the second conductivity in the well; forming a source region of the second conductivity in the well between a substrate/well junction and a well/drift region junction, the source region having relatively higher concentration of dopants relative to the drift region; forming a drain region of the second conductivity in the drift region, the drain region having relatively higher concentration of dopants relative to the drift region; and forming a field oxide layer formed on the drift region such that an edge of the field oxide layer is spaced apart from the drain region by a predetermined distance. The method further includes forming conductive field plate above the field oxide layer such that a portion of the field plate extends beyond the field oxide layer towards the drain region.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. It should be noted that although specific conductivity types are provided in the description, conductivity types can be reversed and still be within the scope of the invention.

Figure 1:
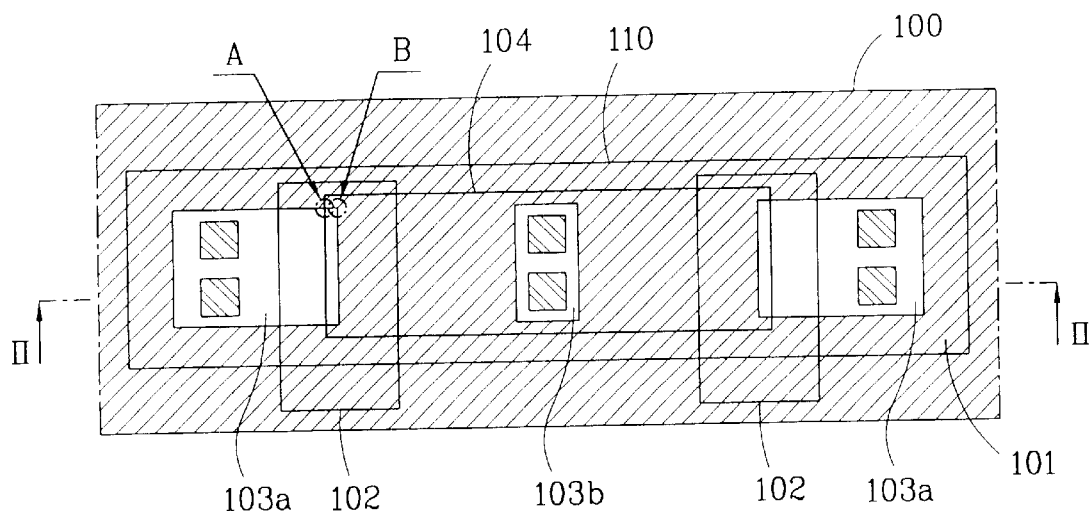
FIG. 1 is a plan view of a semiconductor device in accordance with a conventional art.
Figure 2:
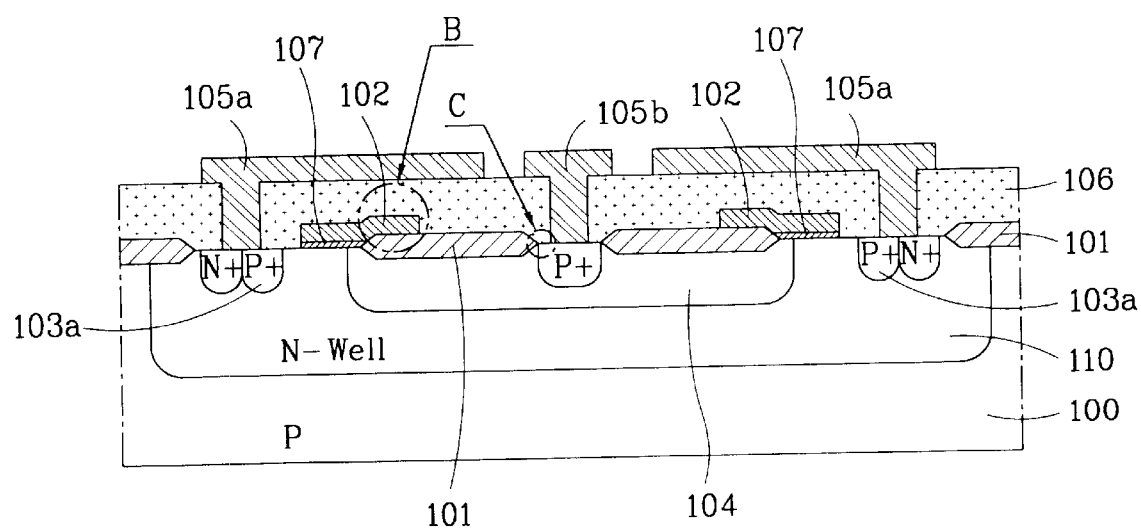
FIG. 2 is a longitudinal-sectional view of the semiconductor device taken along line II—II of FIG. 1 in accordance with the conventional art.
Figure 3:
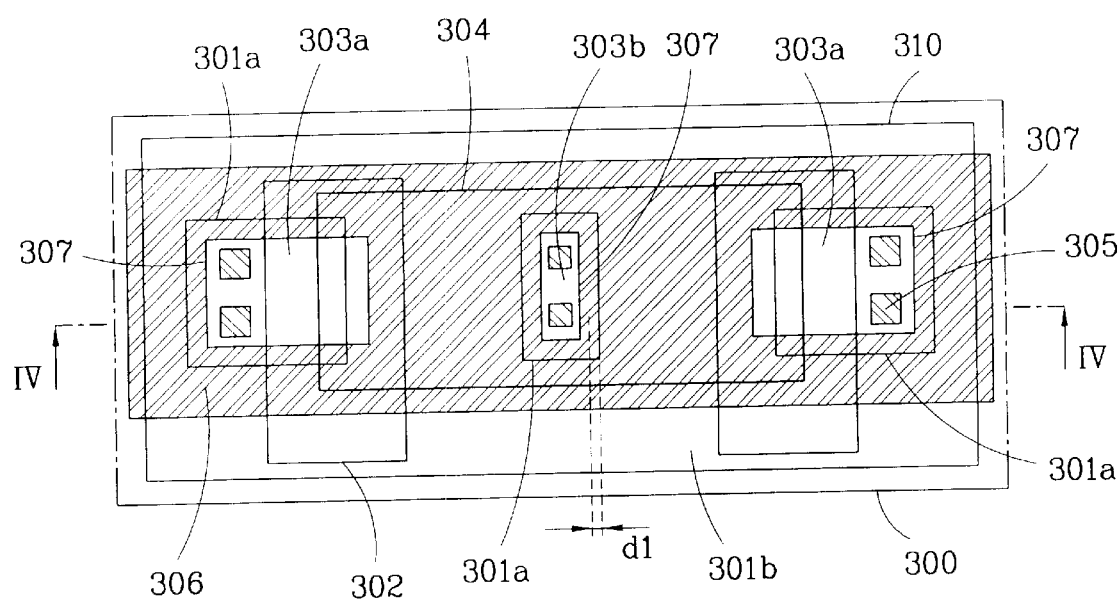
FIG. 3 is a plan view of a semiconductor device in accordance with an embodiment of the present invention.
Figure 4:
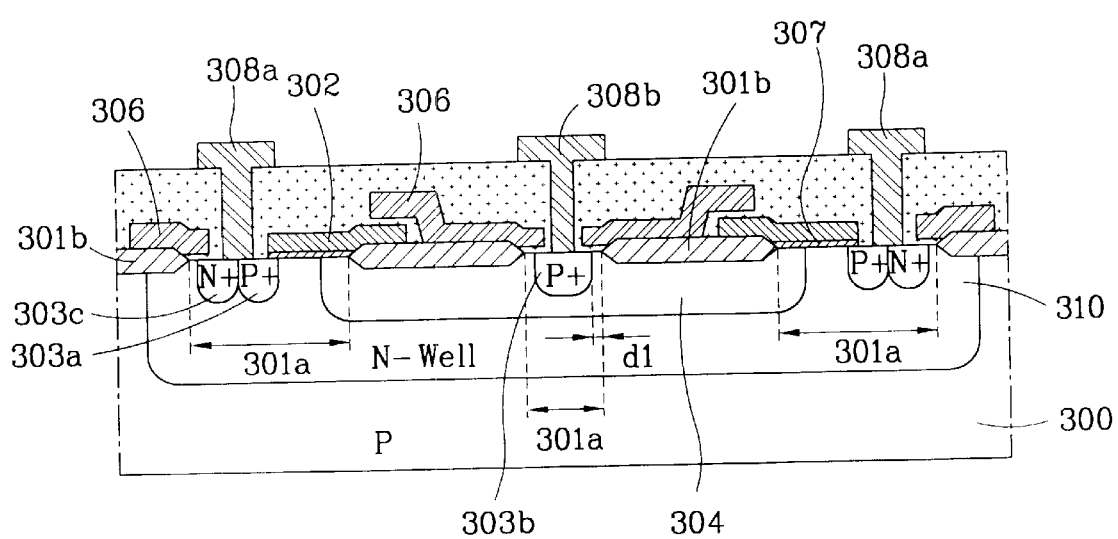
FIG. 4 is a longitudinal-sectional view of the semiconductor device taken along line IV—IV of FIG. 3.

FIG. 3 is a plan view of a semiconductor device in accordance with an embodiment of the present invention and FIG. 4 is a longitudinal-sectional view of the semiconductor device taken along line IV—IV of FIG. 3. As shown, an n-type well region 310 is formed in a semiconductor substrate 300, and a plurality of active regions 301a are defined.

A lightly doped p-type drift region 304 is formed inside the n-type well 310. The drift region 304 is formed to completely surround a drain region 303b and extended to a portion of a channel formed between source and drain regions 303a and 303b. The drift region 304 increases the breakdown voltage when a high voltage is applied to the drain region 303b.

Field oxide layers 301b are formed on the device on areas other than the active regions 301a.

Heavily doped p+-type source and drain regions 303a and 303b are formed in the active regions as shown in FIGS. 3 and 4. More specifically, the source region 303a is formed in the active regions of the n-type well 310 and the drain region 303b is formed near the center of the drift region 304. Also, heavily doped n+-type well tap junction 303c is formed adjacent to the source regions 303a.

A gate electrodes 302 is formed on the n-type well 310 adjacent to the source region 303a and extends to cover a predetermined portion of the upper surface of the field oxide layer 301b. Also, the gate electrode 302 overlaps portions of both the n-type well 310 and the drift region 304.

Field plates 306 are formed over the field oxide layers 301b with openings provided above the source and drain regions 303a and 303b. Field plates are conductive and made of either polysilicon film or a metal film. Note that the field plates 306 extend beyond edges of the field oxide layers 301b. This construction prevents the edges of the field oxide layers 301b from being in direct contact with the source and drain regions 303a and 303b.

The structure is covered with an insulator with contact holes formed above the source and drain regions 303a and 303b. The contact holes are filled to form source and drain electrodes 308a and 308b, respectively. The electrodes are used to apply voltages to the source and drain regions.

As noted above, in the conventional art, the edge of the field oxide layer is in direct contact with the drain region. This can cause impurities from the heavily doped drain region to diffuse outside of the drift region. When this occurs, the junction profile between the drain region and the n-type well becomes very steep resulting in a low breakdown voltage.

However, the embodiment solves this problem. Because the field plate 306 extends beyond the edge of the field oxide layer 301b, the drain region 303b is formed to be spaced apart a predetermined distance ('d1' of FIG. 3) from the field oxide layer 301b. In other words, the field oxide layer 301b and the drain region 303b are not in direct contact. This prevents or minimizes the diffusion of impurities to outside of the drift region leading to a much gentler junction profile, which in turn significantly increases the junction breakdown voltage.

Moreover, the field plate 306 overlaps at least a portion of the gate electrode 302 and the field plate can be connected to ground or negative voltage. This construction allows the electric field to be dispersed. The increase in the breakdown voltage and the dispersion of the electric field improve the reliability of the smart power device.

With references to FIGS. 5A–5J, a method for fabricating the semiconductor device in accordance with the present invention will now be described.

Figure 5A:
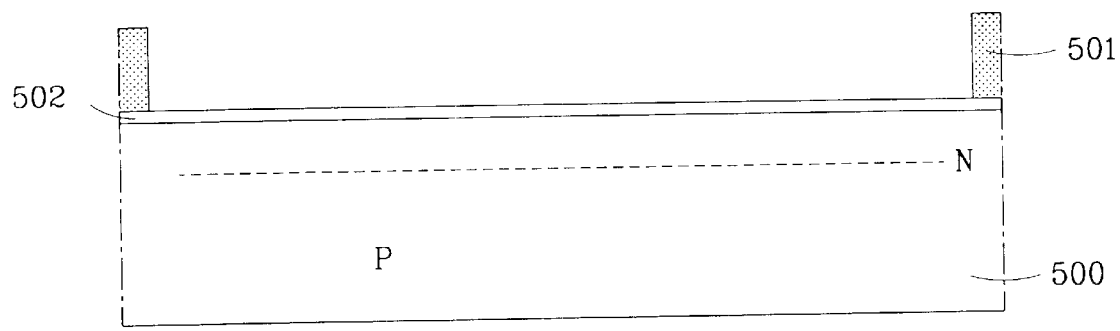
FIGS. 5A through 5J show a sequence of method for fabricating the semiconductor device in accordance with the embodiment of the present invention.

First, as shown in FIG. 5A, a photoresist film pattern 501 is formed on the p-type semiconductor substrate 500. The photoresist film pattern 501 is an ion-implantation mask for forming an n-type well 502. Using the photosensitive film pattern 501, n-type impurities, such as phosphorous or arsenic ions, are implanted into the semiconductor substrate 500 at a dose of $1.5 \times 10^{16}$ atoms/cm$^3$. The n-type impurities are implanted and then diffused through a subsequent heat treatment step to form the n-type well 520 as shown in FIG. 5B.

Figure 5B:
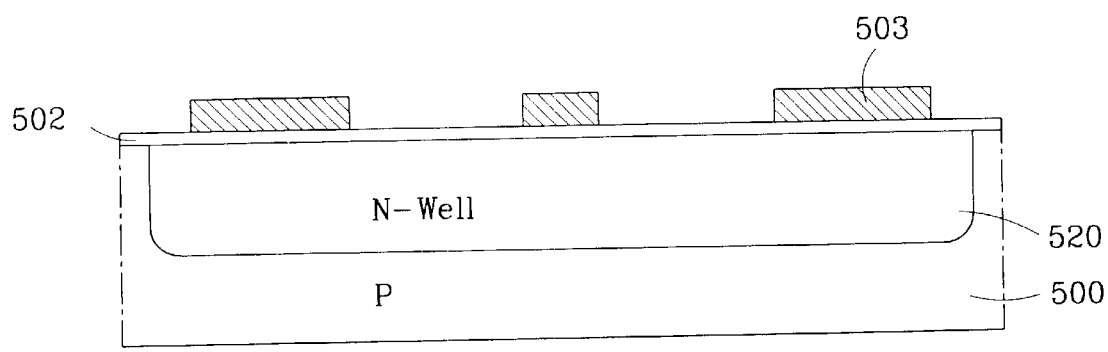

Next, as shown in FIG. 5B, a pad oxide film 502 is formed on the entire surface and a silicon nitride film pattern 503 is formed on the pad oxide film 502. The silicon nitride film pattern 503 is patterned corresponding to the active regions. The silicon nitride film pattern 503 serves block oxidation during a subsequent oxidation process.

Figure 5C:
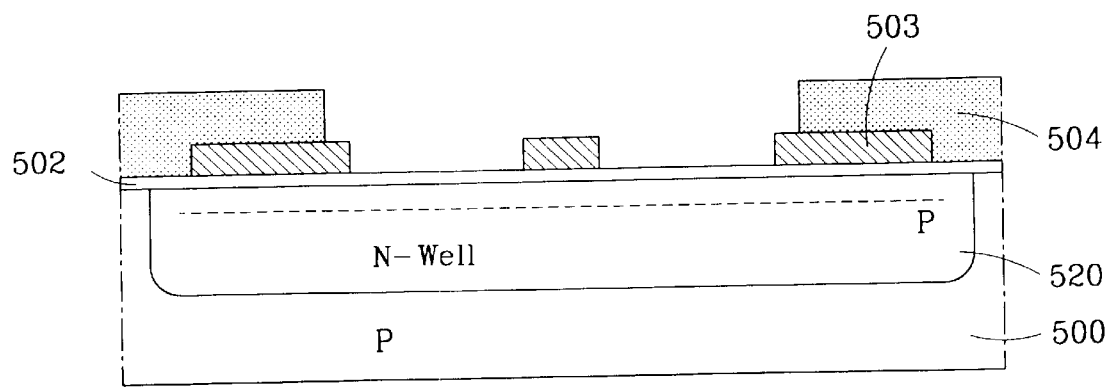

As shown in FIG. 5C, a second photoresist film 504 is formed on the overall structure and patterned to form a drift region mask. Using the photoresist pattern 504, p-type impurities, such as boron ions, are implanted within the n-type well 520 at a dose of $8.0 \times 10^{16}$ atoms/cm$^3$. The impurities implanted in the n-type well 520 are diffused into a n-type well 520 with a subsequent heat treatment process to form a p$^-$-type drift region 505 as shown in FIG. 5D.

An additional heat treatment process may be performed to further diffuse the impurity. However, the method includes a step performed at a high temperature such as in a formation of an insulation layer. Therefore, additional heat treatment process is not necessary.

Figure 5D:
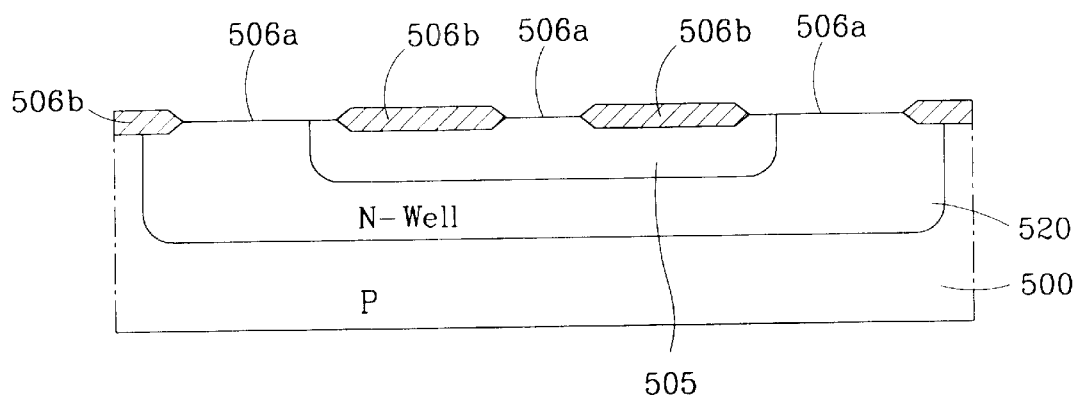

Next, the photoresist film pattern 504 is removed and the surface of the device is oxidized, to thereby form a field oxide layer 506b as shown in FIG. 5d. The silicon nitride film pattern 503 prevents oxidation of the active regions 506a as mentioned above.

Figure 5E:
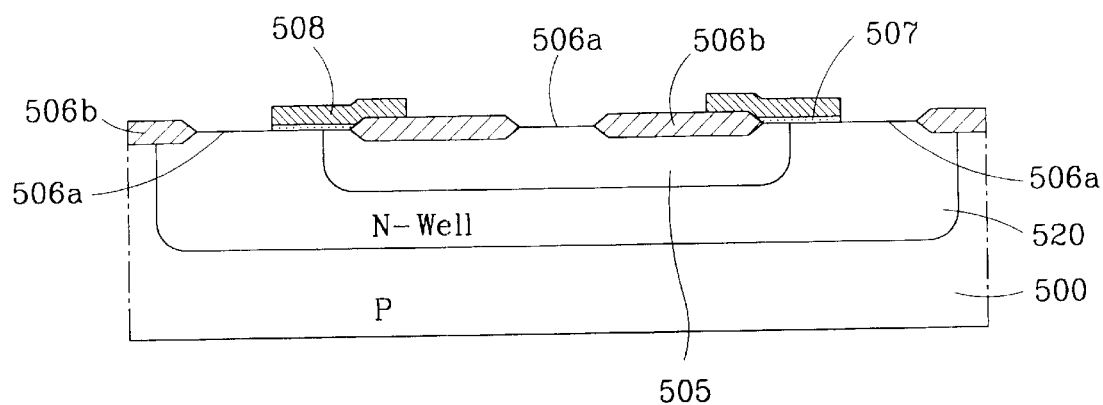

Thereafter, as shown in FIG. 5E, a gate oxide film 507 is formed on the over structure, and a conductive layer, such as a doped polysilicon layer, is formed on the gate oxide film 507. The conductive layer is patterned to form a gate electrode 508 as shown. Note that the gate electrode 508 partially covers an upper surface of the field oxide layer 506b, the drift region 505, and the upper surface of the n-type well 520.

Figure 5F:
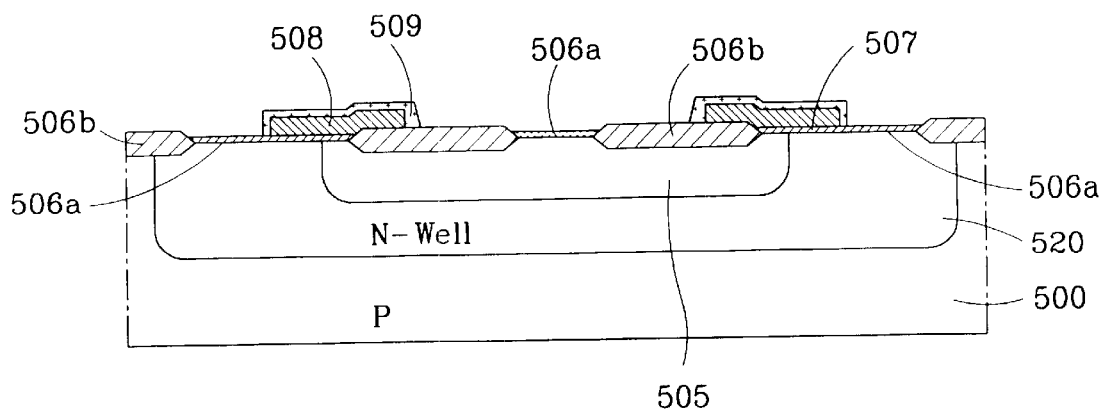

As shown in FIG. 5F, an insulation layer 509 is formed on the overall structure of the FIG. 5E and is partially etched to expose the upper surface of the field oxide layer 506b. The insulation layer 509 remains on upper and side surfaces the gate electrode 508, and on upper surfaces of the active region 506a.

Figure 5G:
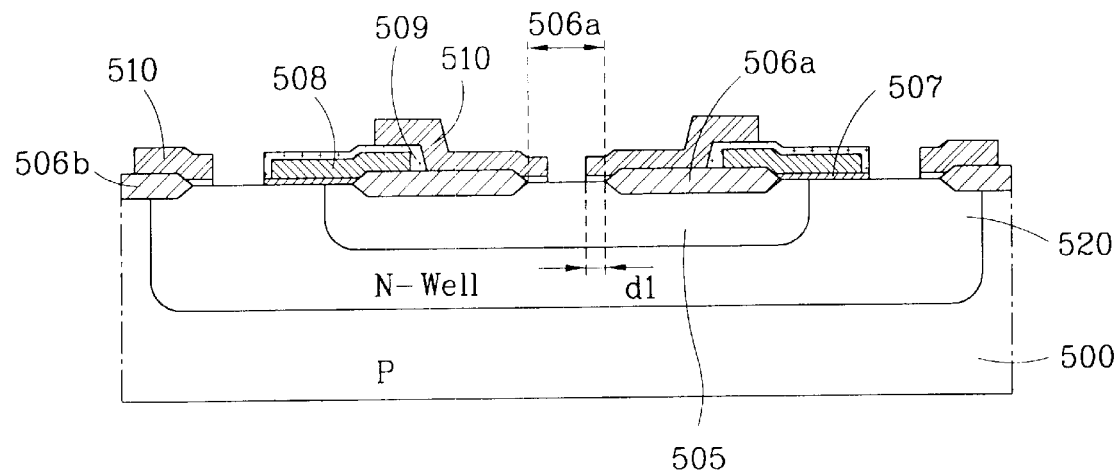

And then, as shown in FIG. 5G, a conductive layer, such as a doped polysilicon layer or a metal layer, is formed on the overall structure of FIG. 5F and is patterned to form a field plate 510. As described previously with reference to FIGS. 3 and 4, the field plate 510 extends beyond the edge of the field oxide layer 506b into a portion of the active region 506a.

Figure 5H:
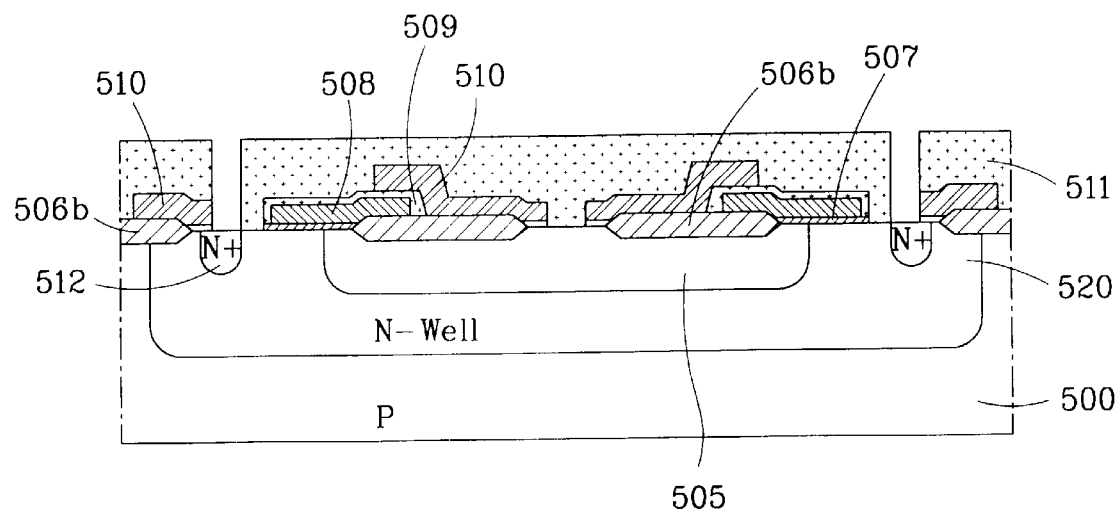

Next, as shown in FIG. 5H, a third photoresist film 511 is formed over the structure and patterned to expose a predetermined portion of the active region so as to form a well tap junction. Using the photoresist pattern 511 as a mask, a high concentration of n-type impurities are implanted into the n-type well 520 to form the well tap junction 512.

Figure 5I:
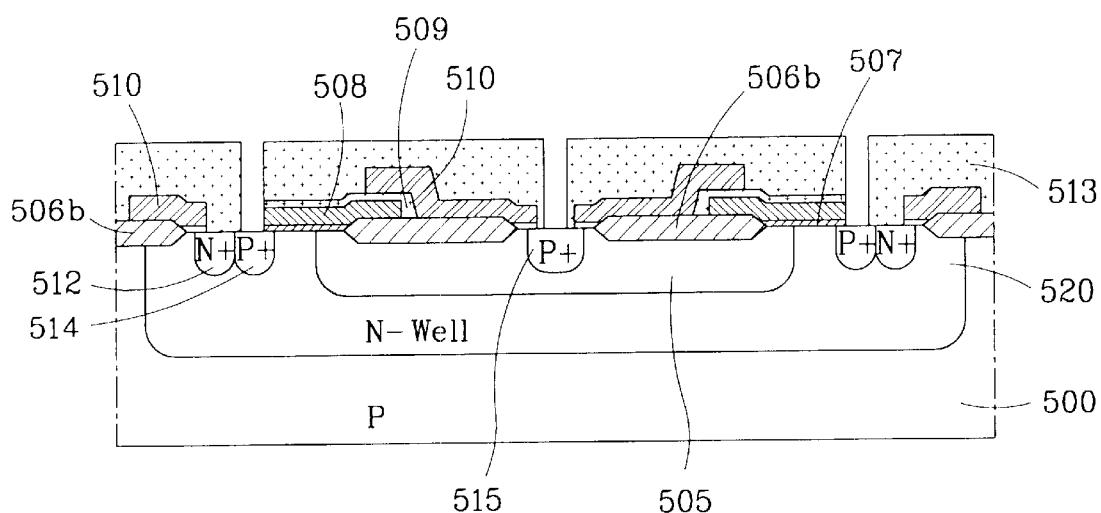

Then, as shown in FIG. 5I, the photoresist film pattern 511 is removed and a fourth photoresist film pattern 513 is formed over the structure with openings above the source and drain regions. Using the photoresist film pattern 513 as a mask, p-type impurities at a high concentration, for example at a dose of $1.0 \times 10^{19}$ atoms/cm$^3$, are implanted to form source and drain regions 514 and 515, respectively. Thereafter, heat treatment is performed.

Figure 5J:
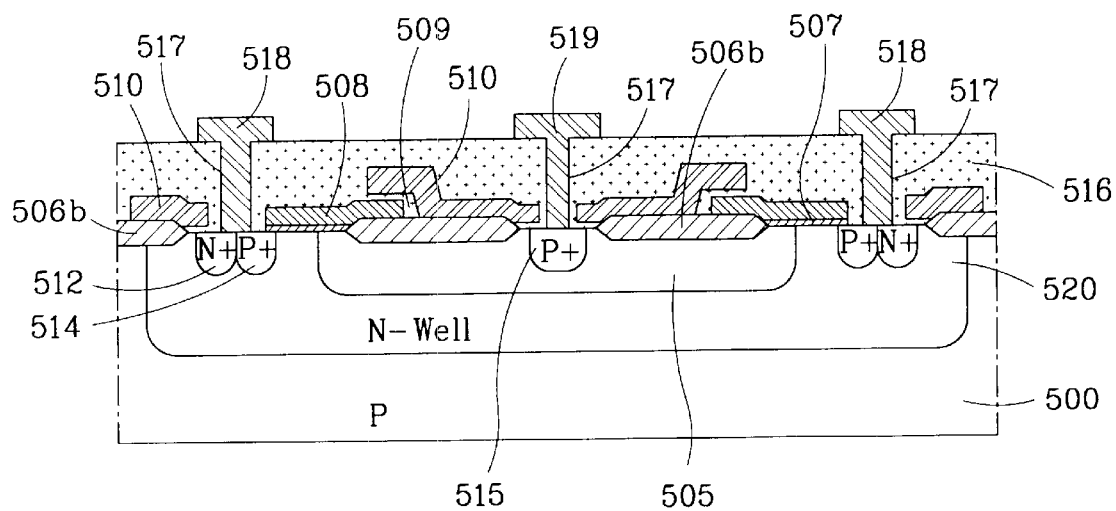

And then, as shown in FIG. 5J, an insulation layer 516 is formed over the overall structure and contact holes 517 are formed over the source and the drain regions 514 and 515. Then, the process is completed by depositing a conductive layer in the contact holes and over the insulation layer and patterning the conductive layer to form source and drain electrodes 518 and 519, respectively.

The smart power device according to the embodiment of the present invention prevents an edge of a field oxide layer to be in direct contact with a drain region. As a result, junction breakdown voltage is significantly increased. Further, field plates disperses high electric fields formed at the edges of the field oxide layer, resulting in further increase of the breakdown voltage.

It will be apparent to those skilled in the art that various modifications and variations can be made in the present invention without departing from the spirit or scope of the invention. Thus, it is intended that the present invention covers such modifications and variations provided they come within the scope of the appended claims and their equivalents.

What is claimed is:

1. A method for fabricating a high power semiconductor device comprising the steps of:

forming a second conductive type well within a first conductive type semiconductor substrate;

forming a first conductive type drift region within the well;

forming a field oxide layer on a portion of the drift region other than an active region;

forming a gate electrode on the well, on a junction where the drift region and the well are contacted, and on the field oxide layer;

forming a first insulation layer on an upper surface and on a side surface of the gate electrode;

forming a field plate on the field oxide layer including an edge portion and further extendedly on the gate electrode;

simultaneously forming a drain aligning with the edge of the field plate within the drift region and a source region aligning with the edge of the gate electrode within the well;

forming a second insulation layer on a whole resultant structure as obtained in the drain region and source region forming step;

forming a contact hole by etching the second insulation layer so as for the source region and the drain region to be exposed, respectively; and forming a source electrode and a drain electrode by filling the contact hole with a conductive layer.

2. The method according to claim 1, wherein in the step for forming the field plate, the field plate is formed in a manner that it is extended from the edge portion of the field oxide layer to the active region, so as to partially cover a predetermined portion of the upper surface of the active region.

3. The method according to claim 1, further includes a step for forming a well tap junction for applying a voltage into the well before or after the step for forming the source and the drain.

4. The method according to claim 3, wherein in the step for forming the well tap junction, the well tap junction is formed adjacent to the source region.

5. A method to fabricate a high voltage transistor of a smart power device, comprising:

forming a well of first conductivity in a substrate of second conductivity;

forming a drift layer of said second conductivity in said well;

forming a source region of said second conductivity in said well between a substrate/well junction and a well/drift layer junction, said source region having relatively higher concentration of dopants relative to said drift layer;

forming a drain region of said second conductivity in said drift layer, said drain region having relatively higher concentration of dopants relative to said drift layer;

forming a first field oxide layer on said drift layer; and forming a conductive first field plate above said first field oxide layer such that a portion of said first field plate extends beyond said first field oxide layer and towards said drain region to separate said drain region from said first field oxide layer.

6. The method of claim 5, further comprising:

forming a second field oxide layer over said substrate/well junction.

7. The method of claim 6, further comprising:

forming a conductive second field plate above said second field oxide layer such that a portion of said second field plate extends beyond said second field oxide layer towards said source region to separate said source region from said second field oxide layer.

8. The method of claim 7, further comprising:

forming a well tap region of said first conductivity adjacent to said source region and between said source region and said second field oxide layer.

9. The method of claim 8, further comprising:

forming a gate electrode such that a portion of said gate electrode is above said first field oxide layer and below said first field plate, said gate electrode also extending to be above a portion of said source region.

10. The device of claim 9, further comprising:

forming an insulator above the entire structure such that source and drain contact holes are formed above said source and drain regions;

forming a source electrode in contact with said source region in and above said source contact hole; and forming a drain electrode in contact with said drain region in and above said drain contact hole.

* * * * *